(12) United States Patent
Hino et al.

(10) Patent No.: US 11,283,460 B2
(45) Date of Patent: Mar. 22, 2022

(54) A/D CONVERTER AND ELECTRONIC EQUIPMENT

(71) Applicant: Sony Semiconductor Solutions Corporation, Kanagawa (JP)

(72) Inventors: Yasufumi Hino, Kanagawa (JP); Yusuke Ikeda, Tokyo (JP); Shinichirou Etou, Kanagawa (JP); Kazutoshi Tomita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/273,570

(22) PCT Filed: Oct. 2, 2019

(86) PCT No.: PCT/JP2019/038839
§ 371 (c)(1),
(2) Date: Mar. 4, 2021

(87) PCT Pub. No.: WO2020/085016
PCT Pub. Date: Apr. 30, 2020

(65) Prior Publication Data
US 2021/0258017 A1 Aug. 19, 2021

(30) Foreign Application Priority Data
Oct. 24, 2018 (JP) .............................. JP2018-200376

(51) Int. Cl.
*H03M 1/38* (2006.01)
*H01L 27/146* (2006.01)
(Continued)

(52) U.S. Cl.
CPC ........ *H03M 1/38* (2013.01); *H01L 27/14612* (2013.01); *H03M 1/1295* (2013.01); *H04N 5/3658* (2013.01); *H04N 5/37455* (2013.01)

(58) Field of Classification Search
CPC ........ H03M 1/38; H03M 1/1295; H03M 1/12; H01L 27/14612; H04N 5/3658; H04N 5/37455; H04N 5/378
(Continued)

(56) References Cited

U.S. PATENT DOCUMENTS 8,749,424 B2 * 6/2014 Ueno ...................... H03M 1/56
341/169
9,813,649 B2 * 11/2017 Yoshida ................ H04N 5/378
(Continued)

FOREIGN PATENT DOCUMENTS

| JP | 2005-252529 A | 9/2005 |
|---|---|---|
| JP | 2013-172270 A | 9/2013 |
| WO | 2013/038958 A1 | 3/2013 |

OTHER PUBLICATIONS

International Search Report (PCT/ISA/210), International Application No. PCT/JP2019/038839, dated Nov. 29, 2019.

*Primary Examiner* — Khai M Nguyen
(74) *Attorney, Agent, or Firm* — Michael Best & Friedrich LLP

(57) ABSTRACT

An A/D converter and electronic equipment are disclosed. In one example, an A/D converter includes a comparator circuit and a first transistor. The comparator circuit compares a threshold voltage ($V_{th}$) to a pixel signal ($S_{VSL}$). The first transistor has a control terminal and forms a clamp circuit, and receives an input of a result of the comparison. When the clamp circuit is turned on (closed), the first transistor equalizes currents flowing to a first predetermined position and a second predetermined position or equalizes voltages at the first predetermined position and the second predetermined position, the first predetermined position and the second predetermined position being connected to each other at the time of clamping. This makes it possible to suppress occur-
(Continued)

rence of streaking in a case where an excessive input is applied to a pixel signal line side.

6 Claims, 16 Drawing Sheets

(51) Int. Cl.
    *H03M 1/12*     (2006.01)
    *H04N 5/365*     (2011.01)
    *H04N 5/3745*     (2011.01)

(58) Field of Classification Search
    USPC .................................. 341/155, 158, 163, 172
    See application file for complete search history.

(56) References Cited

U.S. PATENT DOCUMENTS

| 2005/0194520 A1 | 9/2005 | Koseki |
| 2013/0215303 A1 | 8/2013 | Ueno |

* cited by examiner

A/D CONVERTER AND ELECTRONIC EQUIPMENT

TECHNICAL FIELD

The present disclosure relates to an A/D converter and electronic equipment.

BACKGROUND ART

In recent years, CMOS (Complementary Metal Oxide Semiconductor) image sensors and other imaging devices to which a semiconductor microfabrication technology is applied are widely used, for example, in digital cameras and smartphones.

In these imaging devices, light incident from an object is photoelectrically converted in a photodiode, which is disposed in each pixel as a photoelectric conversion element, then a voltage signal corresponding to an amount of electric charge obtained by such photoelectric conversion is read via an amplifying transistor and a vertical signal line, subjected to analog/digital (A/D) conversion by an A/D converter having a comparator, and outputted as imaging data.

In a case where an image of a high-brightness object is captured by an imaging apparatus using a CMOS or other imaging device, strip-shaped line noise extended in a left-right direction on the captured image, so-called streaking, may be generated due to a power supply noise caused by simultaneous inversion in an A/D conversion section. A technology for suppressing occurrence of streaking is proposed (refer, for example, to PTL 1).

CITATION LIST

Patent Literature

[PTL 1]
Japanese Patent Laid-open No. 2005-252529

SUMMARY

Technical Problem

Incidentally, in a case where an imaging apparatus using a CMOS or other imaging device captures an image of a high-brightness object by use of a sequential A/D converter, that is, in a case where an excessive input is applied to pixel signal lines, significantly different currents flow to differential pair transistors in a preamplifier section included in an A/D conversion section.

Consequently, even at the time of low-order bit conversion, significantly different currents flow to the differential pair transistors, and a time of comparison by a comparator exponentially changes with respect to input signals. As a result, a comparison time difference caused by such input differences might appear as streaking.

The present disclosure has been made in view of the above circumstances. An object of the present disclosure is to provide an A/D converter and electronic equipment that are able to suppress streaking in a case where an excessive input is applied to pixel signal lines.

Solution to Problem

In order to achieve the above object, an A/D converter according to the present disclosure includes a comparator circuit and a first transistor. The comparator circuit performs comparison with a threshold voltage to determine whether or not an excessive input of a pixel signal has been made. The first transistor has a control terminal and forms a clamp circuit, the control terminal being configured to receive an input of a result of the comparison.

When the clamp circuit is turned on (closed), the first transistor equalizes currents flowing to a first predetermined position and a second predetermined position or equalizes voltages at the first predetermined position and the second predetermined position, the first predetermined position and the second predetermined position being connected to each other at the time of clamping. This makes it possible to suppress occurrence of streaking.

Advantageous Effect of the Invention

The present disclosure makes it possible to suppress the streaking by reducing a difference between voltages generated at differential amplifier outputs. It should be noted that advantageous effects described above is merely illustrative and not restrictive. The present disclosure may provide any advantageous effects described in this document.

DESCRIPTION OF EMBODIMENTS

Embodiments of the present disclosure will now be described in detail with reference to the accompanying drawings. It should be noted that, in the following description of the embodiments, identical elements are designated by the same reference signs and will not be redundantly described.

(1) First Embodiment

[Configuration Example of Solid-State Imaging Device]

Figure 1:
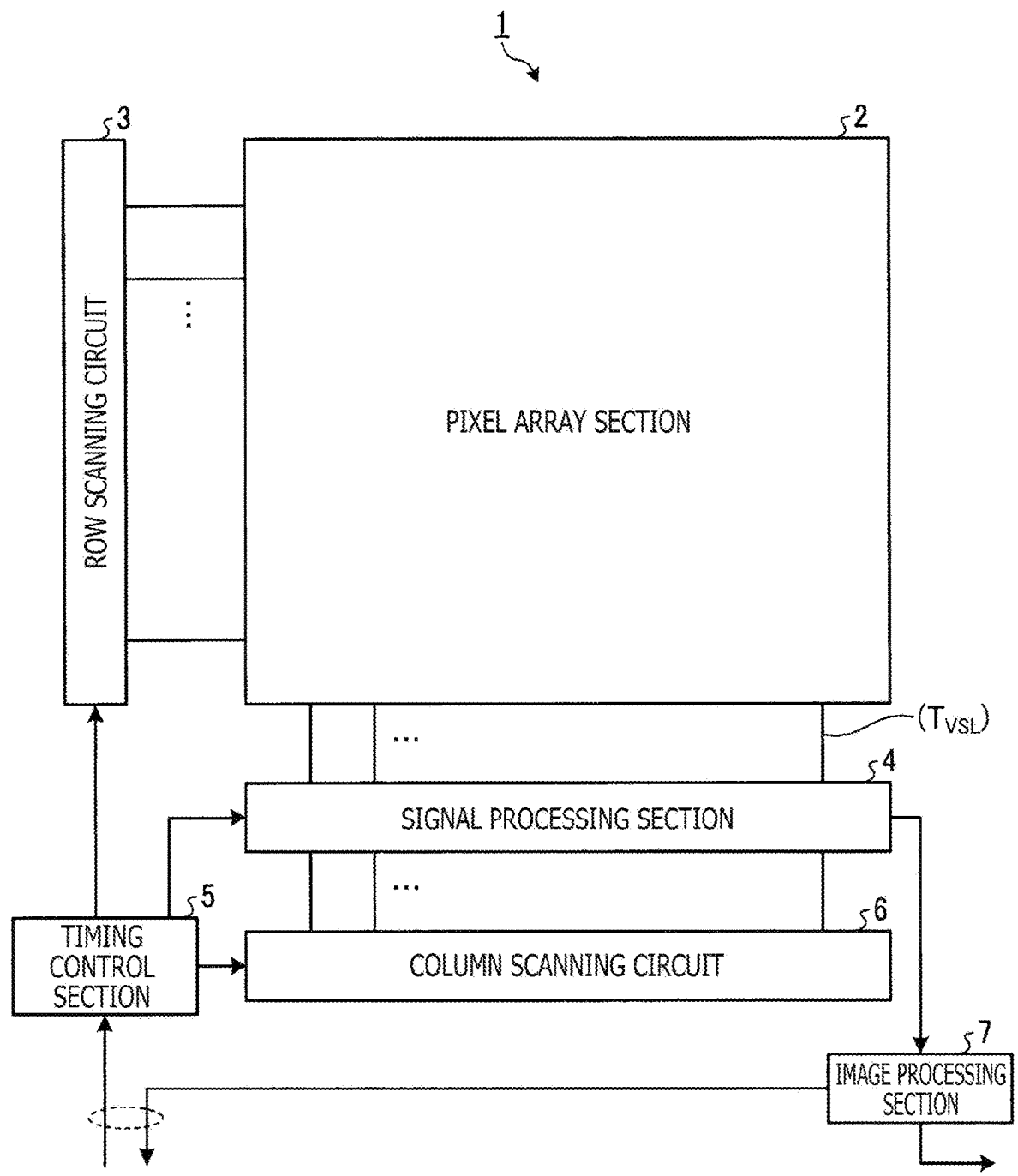
FIG. 1 is a block diagram illustrating a configuration example of a solid-state imaging device according to an embodiment.

FIG. 1 is a block diagram illustrating a configuration example of a solid-state imaging device according to an embodiment.

The solid-state imaging device 1 includes a pixel array section 2, a row scanning circuit 3, a signal processing section 4, a timing control section 5, a column scanning circuit 6, and an image processing section 7.

In the above configuration, the pixel array section 2 includes a plurality of scanning lines and a plurality of signal lines. A pixel circuit is disposed at each intersection between the scanning lines and the signal lines, so that a plurality of pixel circuits is disposed in a two-dimensional matrix.

Under the control of the timing control section 5, the row scanning circuit 3 places any of the plurality of scanning lines in an active state, and causes pixel signals to be outputted by driving pixel circuits for one row, which pixel circuits constitute the pixel array section 2, corresponding to the scanning line placed in the active state.

The signal processing section 4 includes a plurality of later-described A/D converters, and generates pixel data by performing A/D conversion or other signal processing on an inputted pixel signal. The timing control section 5 controls a timing at which each of the row scanning circuit 3, the signal processing section 4, and the column scanning circuit 6 operates.

Under the control of the timing control section 5, the column scanning circuit 6 operates in synchronism with the operations of the row scanning circuit 3 and the signal processing section 4, and sequentially transfers signals subjected to signal processing for respective signal lines in the signal processing section 4 to the image processing section 7 as pixel data.

The image processing section 7 performs various types of image processing on image data including a plurality of pieces of pixel data.

In the image processing, for example, demosaic processing, white balance processing, and the like are performed.

Subsequently, the image data subjected to image processing is transmitted to an external recording apparatus such as an image memory.

The foregoing description assumes that the image processing section 7 is disposed in the solid-state imaging device 1. However, the image processing section 7 may alternatively be separately disposed outside the solid-state imaging device 1.

Further, the circuits in the solid-state imaging device 1 may each be disposed on a single semiconductor substrate or may dispersively be disposed on a plurality of stacked semiconductor substrates.

[Configuration Example of A/D Converter]

Figure 2:
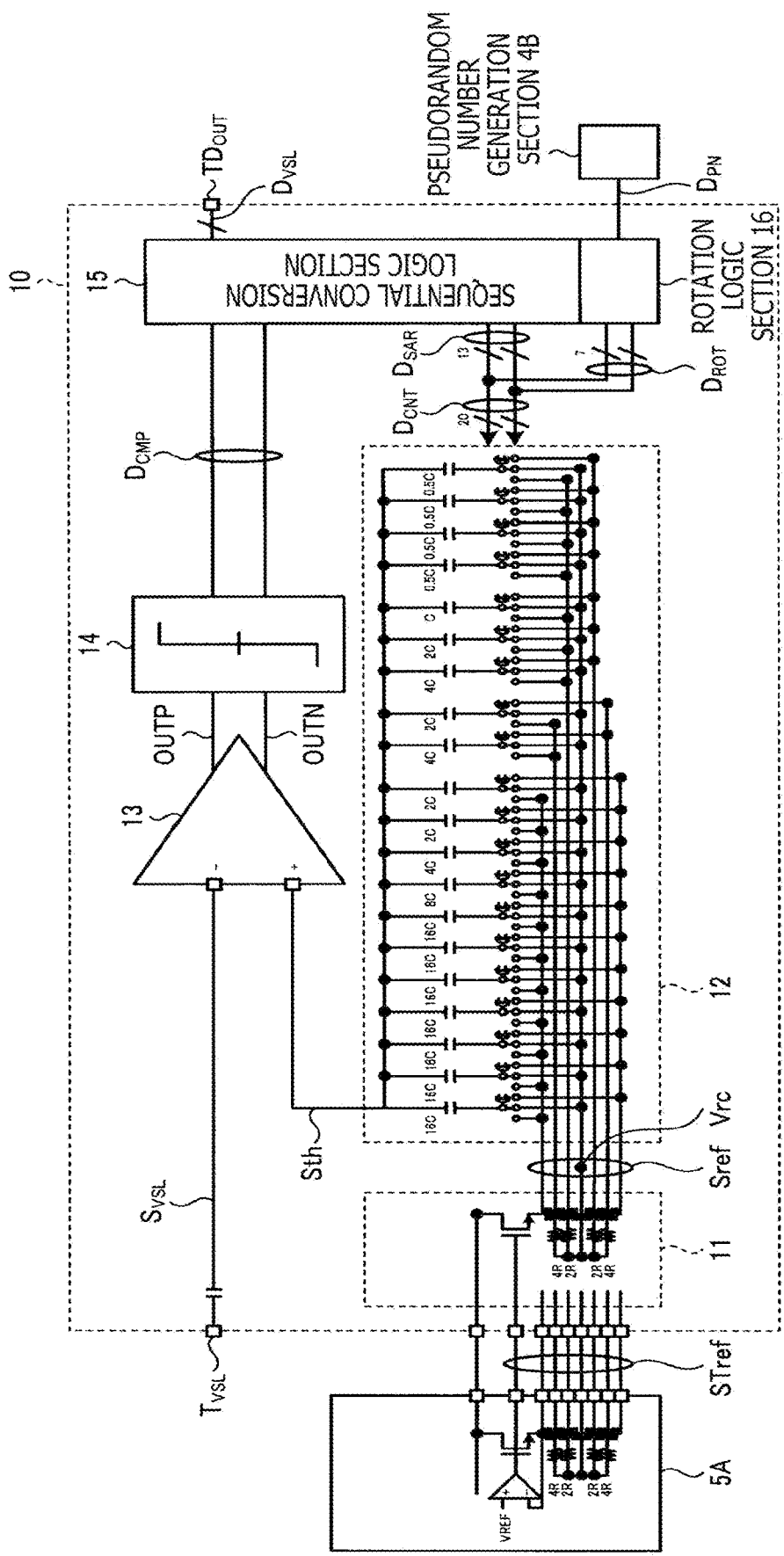
FIG. 2 is a diagram illustrating a configuration example of an embodiment of an A/D converter to which the present technology is applied.

FIG. 2 is a diagram illustrating a configuration example of an embodiment of an A/D converter to which the present technology is applied.

As illustrated in FIG. 2, an A/D converter 10 includes a local reference voltage generation section 11, a D/A conversion section 12, a preamplifier section 13, a comparator section 14, a sequential conversion logic section 15, and a rotation logic section 16.

A plurality of the local reference voltage generation sections 11 is disposed in the signal processing section 4. Based on a standard reference signal (standard reference voltage) STref supplied from a reference voltage generation section 5A, the local reference voltage generation sections 11 generate and output a plurality of types of local standard reference signals (local standard reference voltages) Sref that is to be used in the A/D converter 10.

Under the control of the later-described sequential conversion logic section and rotation logic section, the D/A conversion section 12 performs digital/analog (D/A) conversion on control data $D_{CNT}$ to output a threshold voltage signal $S_{th}$ by using the plurality of types of local standard reference signals Sref generated by the local reference voltage generation sections 11.

The preamplifier section 13 amplifies a pixel signal $S_{VSL}$ inputted from a pixel signal input terminal $T_{VSL}$ of the pixel array section 2 and the threshold voltage signal $S_{th}$, and outputs differential signals OUTP and OUTN.

The comparator section 14 compares the differential signals OUTP and OUTN outputted from the preamplifier section, and outputs a comparison result $D_{CMP}$.

The sequential conversion logic section 15 outputs digital control data $D_{SAR}$ (e.g., 13 bits) for generating the threshold voltage signal $S_{th}$ from the comparison result data $D_{CMP}$. Further, the sequential conversion logic section 15 stores the inputted comparison result data $D_{CMP}$, and outputs pixel data $D_{VSL}$ from an output terminal $TD_{OUT}$ on the basis of the stored comparison result data $D_{CMP}$. The pixel data $D_{VSL}$ represents a result of analog/digital (A/D) conversion of the pixel signal $S_{VSL}$.

The rotation logic section 16 generates data $D_{ROT}$ on the basis of pseudorandom number data $D_{PN}$ supplied from a pseudorandom number generation section 4B disposed in the signal processing section 5.

[Overview of A/D Converter Operations]

Operations of the A/D converter 10 will now be summarized.

The A/D converter 10 sequentially performs comparison from a most significant bit to a least significant bit of the pixel data $D_{VSL}$ representing the result of A/D conversion to set values of all bits (to "1" or "0")

First, the sequential conversion logic section 15 performs initial value setup by setting all bits to a center voltage (Vrc).

In parallel with the above operation, the pseudorandom number generation section 4B supplies the pseudorandom number data $D_{PN}$ to the rotation logic section 16.

The preamplifier section 13 generates the differential signals OUTP and OUTN by amplifying a difference between the inputted pixel signal $S_{VSL}$ and threshold voltage signal $S_{th}$ and outputs the generated differential signals OUTP and OUTN to the comparator section 14.

The comparator section 14 compares voltages of the differential signals OUTP and OUTN and outputs the result as the comparison result data $D_{CMP}$ to the sequential conversion logic section 15.

The sequential conversion logic section 15 generates the control data $D_{SAR}$ and $D_{ROT}$ for the D/A conversion section 12 according to a result of the comparison result data $D_{CMP}$ and stores the comparison result data $D_{CMP}$.

The D/A conversion section 12 performs digital/analog (D/A) conversion on the inputted control data $D_{CNT}$ by using the plurality of types of local standard reference signals Sref generated by the local reference voltage generation sections 11, and outputs the threshold voltage signal $S_{th}$ to the preamplifier section 13.

Subsequently, all bits from the most significant bit (MSB) to the least significant bit (LSB) are sequentially compared in a manner similar to the above, and the sequential conversion logic section 15 determines and stores the values of all bits.

When the values of all bits are determined, the stored data is outputted from the output terminal $TD_{OUT}$ as A/D conversion result data.

[Problem with Conventional A/D Converters]

A problem with conventional technologies regarding A/D converters will now be described.

Figure 3:
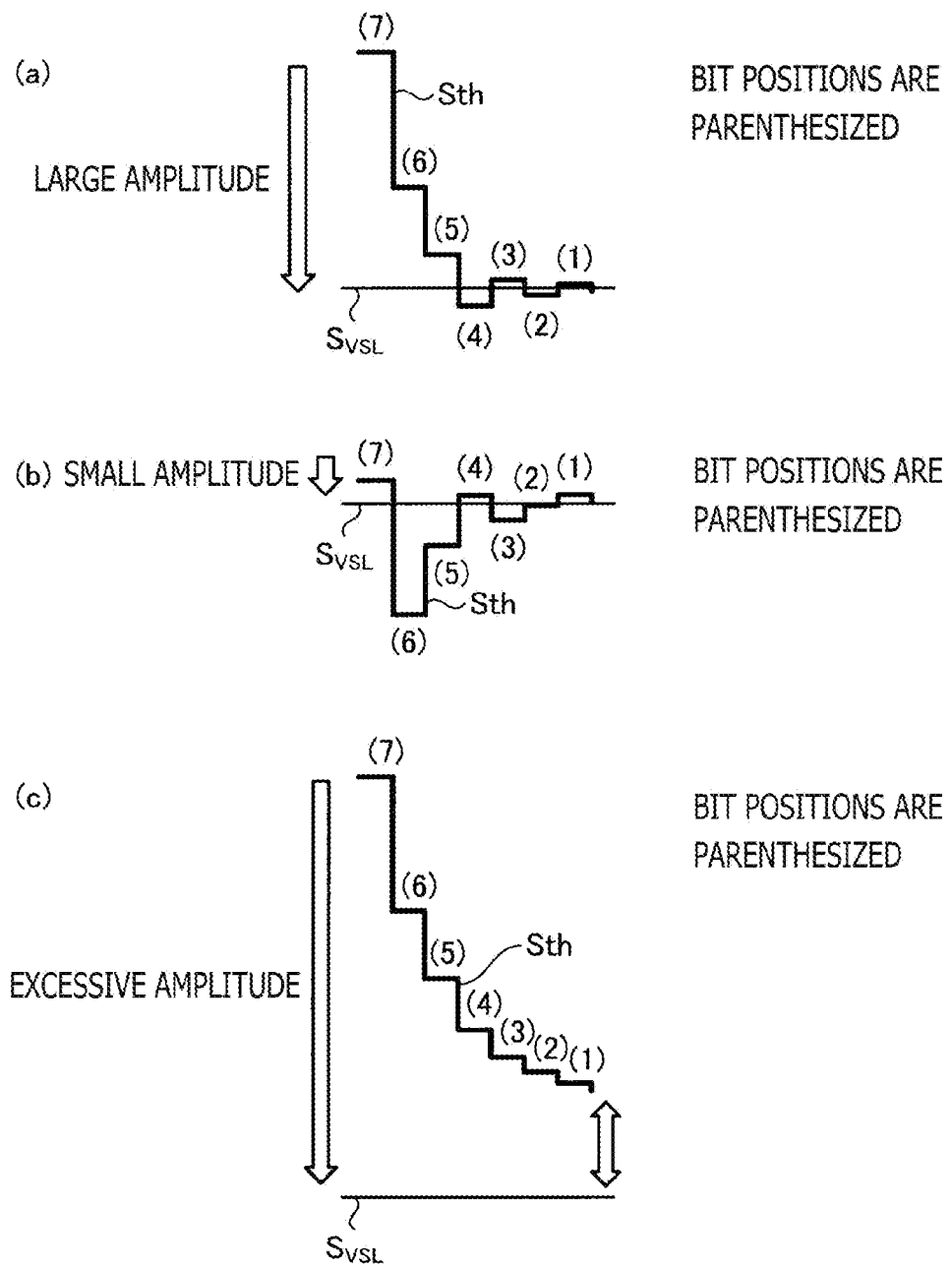
FIG. 3 is a set of diagrams illustrating a relation between a voltage of a pixel signal and a voltage of a threshold voltage signal in a case where a 7-bit A/D converter is used.

FIG. 3 is a set of diagrams illustrating a relation between the voltage of the pixel signal and the voltage of the threshold voltage signal in a case where a 7-bit A/D converter is used as an example.

As regards the pixel signal $S_{VSL}$ in FIG. 3, a lower side represents a low-voltage state (white side), and an upper side represents a high-voltage state (black side). The horizontal axis represents time.

Referring to FIG. 3, it is assumed that an x-th bit at the time of A/D conversion is designated by (x). For example, an input signal at the time of MSB conversion corresponds to (7), and an input signal at the time of LSB conversion corresponds to (1).

Depicted in (a) of FIG. 3 is a case where the difference between the voltage of the pixel signal $S_{VSL}$ and the voltage of the threshold voltage signal $S_{th}$ is great but within an A/D conversion range at the beginning of comparison. Depicted in (b) of FIG. 3 is a case where the difference between the voltage of the pixel signal $S_{VSL}$ and the voltage of the threshold voltage signal $S_{th}$ is small and within the A/D conversion range at the beginning of comparison. Depicted in (c) of FIG. 3 is a case where the difference between the voltage of the pixel signal $S_{VSL}$ and the voltage of the threshold voltage signal $S_{th}$ is extremely great (excessive amplitude) and beyond the A/D conversion range.

A sequential A/D converter changes the threshold voltage $S_{th}$ according to the result of comparison by a comparator so as to approach the pixel signal $S_{VSL}$. Therefore, in the cases where the pixel signal is within the range ((a) and (b) of FIG. 3), the difference between the pixel signal $S_{VSL}$ and the threshold voltage $S_{th}$ is small and not greater than 1 LSB at the time of LSB conversion (1).

Meanwhile, in the case of the example depicted in (c) of FIG. 3, the difference between the pixel signal $S_{VSL}$ and the threshold voltage $S_{th}$ is significant and greater than 1 LSB even at the time of LSB conversion (1) Since a time of comparison by the comparator exponentially changes with respect to an input signal, a comparison time difference caused by this input difference appears as streaking.

[Detailed Configuration of Comparator Section According to First Embodiment]

Figure 4:
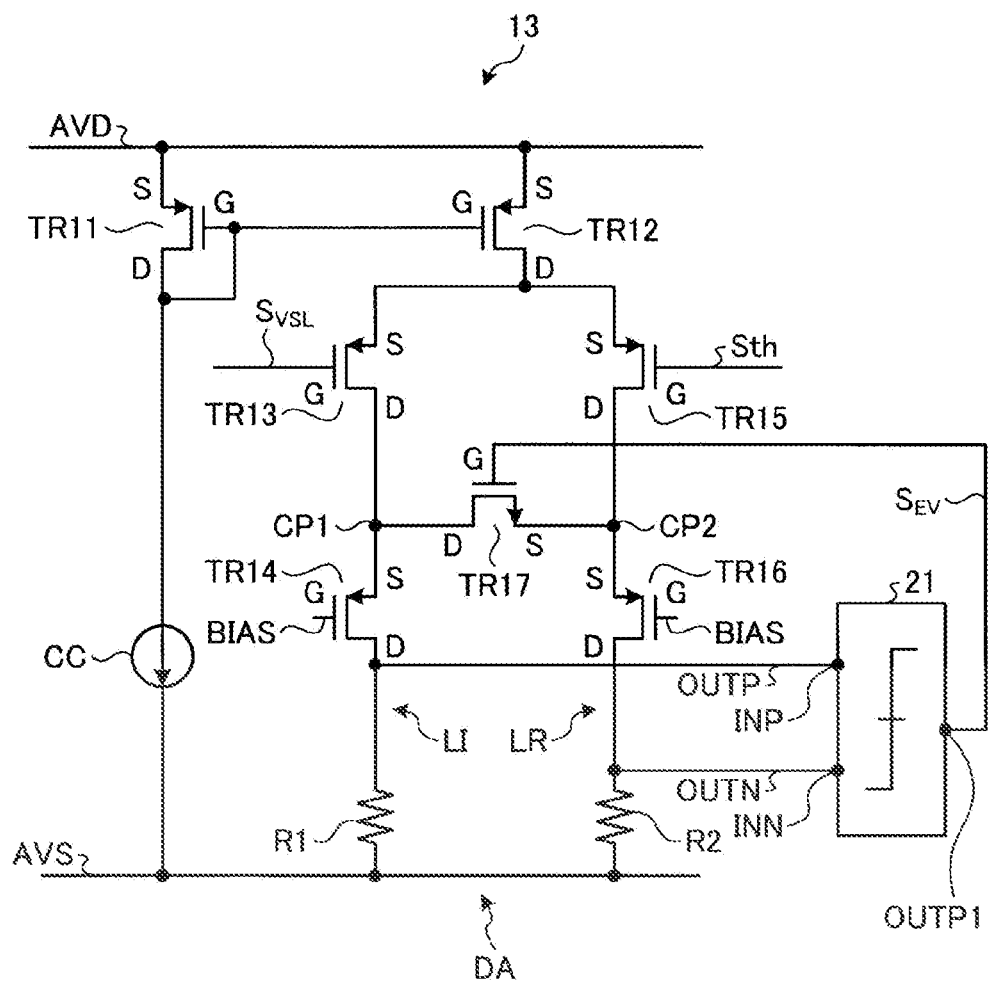
FIG. 4 is a diagram illustrating a detailed configuration of a preamplifier section according to a first embodiment.

FIG. 4 is a diagram illustrating a detailed configuration of the preamplifier section 13 according to the first embodiment.

The preamplifier section 13 includes a P-channel MOS transistor TR11, a P-channel MOS transistor TR12, and a constant current supply CC. The P-channel MOS transistor TR11 is configured such that a source terminal S is connected to a power supply line AVD and a gate terminal G is connected to the drain terminal D to form a diode connection. The P-channel MOS transistor TR12 is configured such that a source terminal S is connected to the power supply AVD and a gate terminal G is connected to the gate terminal G of the P-channel MOS transistor TR11, so that the P-channel MOS transistor TR12 functions as a current mirror circuit in cooperation with the P-channel MOS transistor TR11. The constant current supply CC is connected at one end to the drain terminal D of the P-channel MOS transistor TR11 and at another end to a ground line AVS.

Further, the preamplifier section 13 includes a P-channel MOS transistor TR13, a P-channel MOS transistor TR14, and a first load resistance R1. The P-channel MOS transistor TR13 is configured such that a pixel signal $S_{VSL}$ is inputted to a gate terminal G and a source terminal S is connected to a drain terminal D of the P-channel MOS transistor TR12. The P-channel MOS transistor TR14 is configured such that a source terminal S is connected to a drain terminal D of the P-channel MOS transistor TR13 and a bias voltage BIAS is inputted to a gate terminal G, so that the P-channel MOS transistor TR14 functions as a cascode circuit. The first load resistance R1 is connected at one end to a drain terminal D of the P-channel MOS transistor TR14 and at another end to the ground line AVS.

Furthermore, the preamplifier section 13 includes a P-channel MOS transistor TR15, a P-channel MOS transistor TR16, and a second load resistance R2. The P-channel MOS transistor TR15 is configured such that a threshold voltage signal $S_{th}$ is inputted to a gate terminal G and a source terminal S is connected to the drain terminal D of the P-channel MOS transistor TR12. The P-channel MOS transistor TR16 is configured such that a source terminal S is connected to a drain terminal D of the P-channel MOS transistor TR15 and a bias voltage BIAS is inputted to a gate terminal G, so that the P-channel MOS transistor TR16 functions as a cascode circuit. The second load resistance R2 is connected at one end to a drain terminal D of the P-channel MOS transistor TR16 and at another end to the ground line AVS.

Moreover, the preamplifier section 13 includes a threshold value determination circuit 21. One input terminal of the threshold value determination circuit 21 is connected to the drain terminal of the P-channel MOS transistor TR14 so as to receive an input of a first output signal OUTP. Another input terminal of the threshold value determination circuit 21 is connected to the drain terminal of the P-channel MOS transistor TR16 so as to receive an input of a second output signal OUTN. The threshold value determination circuit 21 compares the first output signal OUTP and the second output signal OUTN and outputs a determination result signal $S_{EV}$.

Additionally, the preamplifier section 13 includes an N-channel MOS transistor TR17. The N-channel MOS transistor TR17 is configured such that a drain terminal D is connected to a connection point CP1 between the drain terminal D of the P-channel MOS transistor TR13 and the source terminal of the P-channel MOS transistor TR14, and a source terminal D is connected to a connection point CP2 between the drain terminal D of the P-channel MOS transistor TR15 and the source terminal of the P-channel MOS transistor TR16. The N-channel MOS transistor TR17 functions as a switching element (switch) that forms a short circuit between the connection points CP1 and CP2 when the determination result signal $S_{EV}$ outputted from the threshold value determination circuit 21 is inputted to a gate terminal G of the N-channel MOS transistor TR17.

In the above configuration, the N-channel MOS transistor TR17 forms a clamp circuit.

Further, the P-channel MOS transistor TR13, the P-channel MOS transistor TR14, the P-channel MOS transistor TR15, the P-channel MOS transistor TR16, the first load resistance R1, and the second load resistance R2 form a differential amplifier DA.

In a case where the pixel signal $S_{VSL}$ is within a predetermined A/D conversion range, the difference between the voltage of the pixel signal $S_{VSL}$ and the voltage of the threshold voltage signal $S_{th}$ is small at the time of LSB conversion. Therefore, a difference between the first output signal OUTP and the second output signal OUTN, which are outputted from the preamplifier section 13, is also small.

Meanwhile, in a case where the pixel signal $S_{VSL}$ is an excessive input signal beyond the predetermined A/D conversion range and the N-channel MOS transistor TR17 is turned off (placed in an open state), the difference between the first output signal OUTP and the second output signal OUTN, which are outputted from the preamplifier section 13, remains great even at the time of LSB conversion.

When, in the above case, the N-channel MOS transistor TR17 is turned on (placed in a closed state), currents flowing to the load resistances R1 and R2 can be made equal to each other, so that the first output signal OUTP and the second output signal OUTN are at the same potential.

Consequently, the time of conversion by the comparator section 14 connected in a subsequent stage can be made the same. This makes it possible to reduce the degree of deterioration caused by streaking arising from the difference in the speed of comparator conversion.

A method of determining an excessive input signal will now be described.

Before normal A/D conversion processing, the threshold voltage $S_{th}$ is set to an excessive input determination voltage $V_{th}$ and then the threshold value determination circuit 21 is used to compare the voltage of the pixel signal $S_{VSL}$ with the excessive input determination voltage $V_{th}$. In a case where the result of comparison indicates that the voltage of the pixel signal $S_{VSL}$ is lower than the excessive input determination voltage $V_t$ (the excessive input determination voltage $V_{th}$ regarded as the threshold voltage is higher), it is determined that the pixel signal $S_{VSL}$ is beyond the A/D conversion range (is an excessive input signal). Therefore, the N-channel MOS transistor TR17 is turned on (placed in the closed state).

Meanwhile, in a case where the voltage of the pixel signal $S_{VSL}$ is higher than the excessive input determination voltage $V_{th}$ (the excessive input determination voltage $V_{th}$ regarded as the threshold voltage is lower), it is determined that the pixel signal $S_{VSL}$ is within the A/D conversion range. Therefore, the N-channel MOS transistor TR17 is kept off (left in the open state).

Subsequently, normal A/D conversion processing is performed.

[Circuit Configuration Example of Comparator Section]

A circuit configuration example of the comparator section 14 will now be described.

Figure 5:
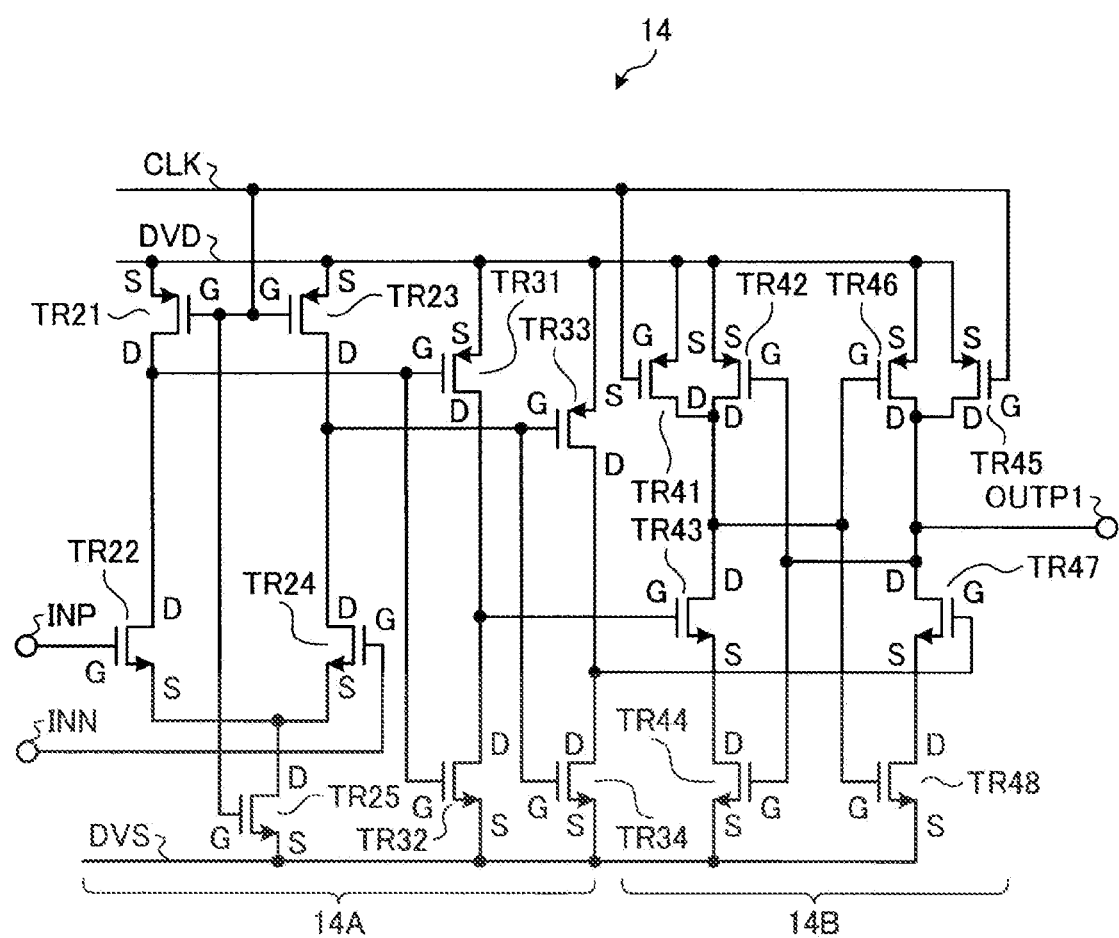
FIG. 5 is a diagram illustrating a circuit configuration example of a threshold value determination circuit.

FIG. 5 is a diagram illustrating the circuit configuration example of the comparator circuit 14.

As illustrated in FIG. 5, the comparator section 14 is roughly divided into an amplification section (amplification stage) 14A and a latch section 14B.

The amplification section 14A includes a P-channel MOS transistor TR21, an N-channel MOS transistor TR22, a P-channel MOS transistor TR23, an N-channel MOS transistor TR24, and an N-channel MOS transistor TR25. The P-channel MOS transistor TR21 is configured such that a source terminal S is connected to a digital power supply DVD and a gate terminal G is connected to a clock signal line CLK. The N-channel MOS transistor TR22 is configured such that a drain terminal D is connected to a drain terminal of the P-channel MOS transistor TR21 and a gate terminal G is connected to a positive input terminal INP. The P-channel MOS transistor TR23 is configured such that a source terminal S is connected to the digital power supply DVD and a gate terminal is connected to the clock signal line CLK. The N-channel MOS transistor TR24 is configured such that a drain terminal D is connected to a drain terminal D of the P-channel MOS transistor TR23 and a gate terminal G is connected to a negative input terminal INN. The N-channel MOS transistor TR25 is configured such that a drain terminal D is connected in common to a source terminal S of the N-channel MOS transistor TR22 and to a source terminal S of the N-channel MOS transistor TR24, and a gate terminal G is connected to the clock signal line CLK, and a source terminal S is connected to a digital ground DVS.

Further, the amplification section 14A includes inverters TR31 and TR32 and inverters TR33 and TR34. These inverters cooperate with one another to achieve signal amplification.

The latch section 14B includes a P-channel MOS transistor TR41, a P-channel MOS transistor TR42, an N-channel MOS transistor TR43, and an N-channel MOS transistor TR44. The P-channel MOS transistor TR41 is configured such that a source terminal S is connected to the digital power supply DVD and a gate terminal G is connected to the clock signal line CLK. The P-channel MOS transistor TR42 is configured such that a source terminal S is connected to the digital power supply DVD and a drain terminal D is connected to a drain terminal D of the P-channel MOS transistor TR41. The N-channel MOS transistor TR43 is configured such that a drain terminal D is connected to the drain terminal D of the P-channel MOS transistor TR41 and to the drain terminal D of the P-channel MOS transistor TR42 and a gate terminal G is connected to a drain terminal D of a P-channel MOS transistor TR31 and to a drain terminal D of an N-channel MOS transistor TR32. The N-channel MOS transistor TR44 is configured such that a drain terminal D is connected to a source terminal S of the N-channel MOS transistor TR43, a source terminal S is connected to the digital ground DVS, and a gate terminal G is connected to a gate terminal G of the P-channel MOS transistor TR42.

Further, the latch section 14B includes a P-channel MOS transistor TR45, a P-channel MOS transistor TR46, an N-channel MOS transistor TR47, and an N-channel MOS transistor TR48. The P-channel MOS transistor TR45 is configured such that a source terminal S is connected to the digital power supply DVD and a gate terminal G is connected to the clock signal line CLK. The P-channel MOS transistor TR46 is configured such that a source terminal S is connected to the digital power supply DVD, a drain terminal D is connected to a drain terminal D of the P-channel MOS transistor TR45, and a gate terminal G is connected to the drain terminal D of the P-channel MOS transistor TR42 and to the drain terminal D of the N-channel MOS transistor TR43. The N-channel MOS transistor TR47 is configured such that a drain terminal D is connected to the drain terminal D of the P-channel MOS transistor TR45 and to the drain terminal D of the P-channel MOS transistor TR46 and a gate terminal G is connected to a drain terminal D of a P-channel MOS transistor TR33 and to a drain terminal D of an N-channel MOS transistor TR34. The N-channel MOS transistor TR48 is configured such that a drain terminal D is connected to a source terminal S of the N-channel MOS transistor TR47, a source terminal S is connected to the digital ground DVS, and a gate terminal G is connected to the gate terminal G of the P-channel MOS transistor TR46.

In the above configuration, the comparator section 14 outputs a comparator output OUTP according to signals INP and INN inputted at the time of a rise in the clock signal line CLK.

[Operations of Threshold Value Determination Circuit]

Figure 6:
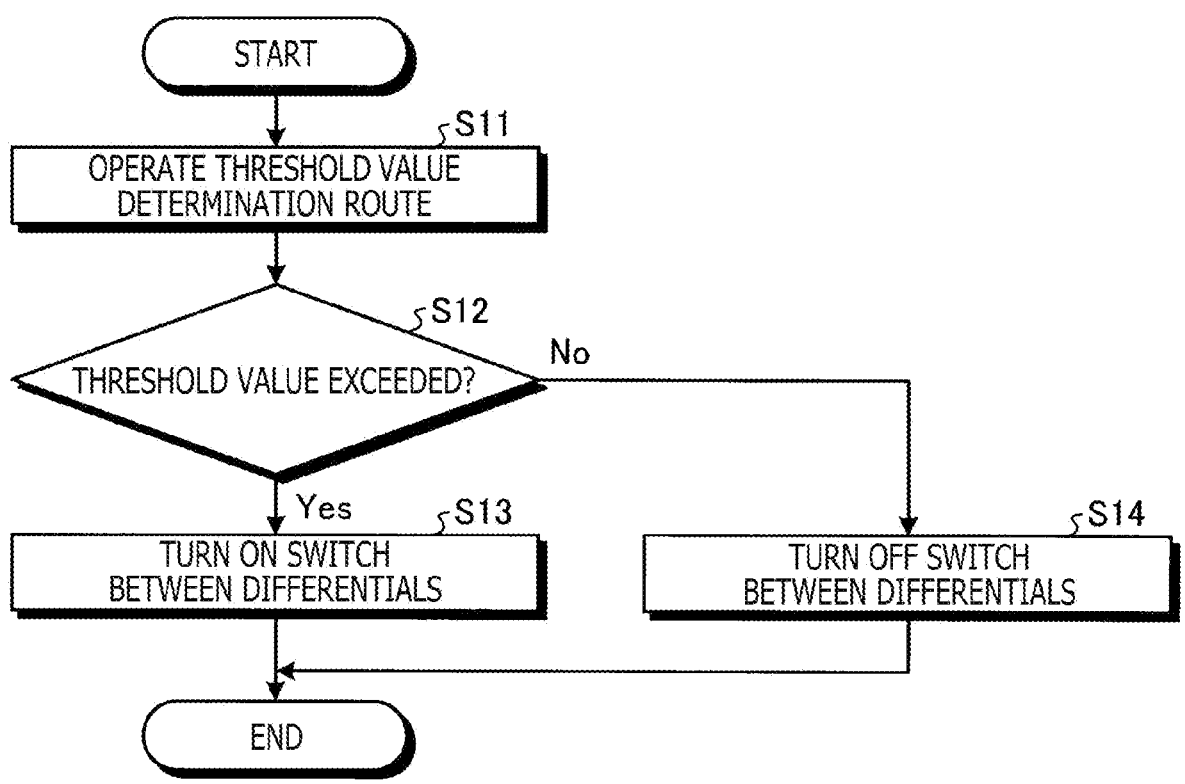
FIG. 6 is a flowchart illustrating a process performed by the threshold value determination circuit (threshold value determination route).

FIG. 6 is a flowchart illustrating a process performed by an excessive input determination circuit (threshold value determination circuit).

First, the threshold voltage $S_{th}$ is set to the excessive input determination voltage $V_{th}$ for determining an excessive input (step S11).

In the above instance, voltage setup may be performed by extending functionality of the D/A conversion section 12 or by providing a separate setting circuit.

Next, the threshold value determination circuit 21 is used to compare the pixel signal $S_{VSL}$ with the excessive input determination voltage $V_{th}$ and determine whether the pixel signal $S_{VSL}$ is lower than the excessive input determination voltage $V_{th}$ (whether the pixel signal $S_{VSL}$ is an excessive input beyond the range of the A/D converter 10) (step S12). The threshold value determination circuit may alternatively use the comparator section 14 for determination purposes.

In a case where the result of determination in step 312 indicates that the pixel signal $S_{VSL}$ is higher than the excessive input determination voltage ("NO" at step S12), the threshold value determination circuit 21 determines that an excessive input (an excessive voltage input) is not applied to the gate terminal G of the P-channel MOS transistor TR13, which is one input terminal of the differential amplifier, and outputs an "L" level determination result signal $S_{EV}$ to the gate terminal G of the N-channel MOS transistor TR17.

Consequently, the N-channel MOS transistor TR17 is kept off (left in the open state) (step S14).

As a result, the differential amplifier DA remains in a normal operating state.

Meanwhile, in a case where the result of determination in step S12 indicates that the pixel signal $S_{VSL}$ is lower than the excessive input determination voltage $V_L$, (the pixel signal $S_{VSL}$ is an excessive input beyond the range of the A/D converter 10) ("YES" at step S12), the threshold value determination circuit 21 determines that an excessive input (an excessive voltage input) is applied to the gate terminal G of the P-channel MOS transistor TR13, which is one input terminal of the differential amplifier DA, and outputs an "H" level determination result signal $S_{EV}$ to the gate terminal G of the N-channel MOS transistor TR17.

Consequently, the N-channel MOS transistor TR17 is turned on (placed in the closed state) (step S13).

As a result, a short circuit is formed between the connection points CP1 and CP2, so that the output voltages OUTP and OUTN are substantially equal to each other.

Accordingly, a value of a voltage difference inputted to the comparator section 14 is extremely small even when an excessive input voltage is applied. Therefore, even at the time of an excessive input operation, the input to the comparator section 14 can be reduced, so that the speed of conversion can be made similar to those for other pixel signals. This makes it possible to reduce the deterioration caused by streaking.

Advantageous Effect of First Embodiment

As described above, even in a case where an excessive input is applied to the differential amplifier DA, the first embodiment is able to make a response time required at the time of low-order bit conversion similar to that in the case where no excessive input is applied to the differential amplifier DA. This makes it possible to reduce the deterioration caused by streaking.

First Modification of First Embodiment

The configuration described above assumes that the threshold voltage $S_{th}$ is once set to the excessive input determination voltage $V_{th}$, and that the result of determination by the threshold value determination circuit 21 is directly outputted to the gate terminal G of the N-channel MOS transistor TR17.

However, without setting the threshold voltage $S_{th}$ to the excessive input determination voltage $V_{th}$ for once, an alternative configuration may be adopted so as to sequentially perform A/D conversion as a normal operation, determine an excessive input in a case where the results of determination made by the comparator section 14 for several sequential high-order bits are "H," and turn on the NMOS transistor TR17. Adopting the above alternative configuration eliminates necessity of setting the threshold voltage $S_{th}$ to the excessive input determination voltage $V_{th}$ and making an excessive input determination. Therefore, the required A/D conversion time is for actual A/C conversion only, and no extra A/D conversion time is required. This increases the speed of processing.

When the above-described configuration is adopted, the operations according to the first embodiment can be implemented simply by changing wiring from the N-channel MOS transistor TR17 and the sequential conversion logic section 15 to the gate terminal G and changing a control program of the sequential conversion logic section 15.

Second Modification of First Embodiment

Figure 7:
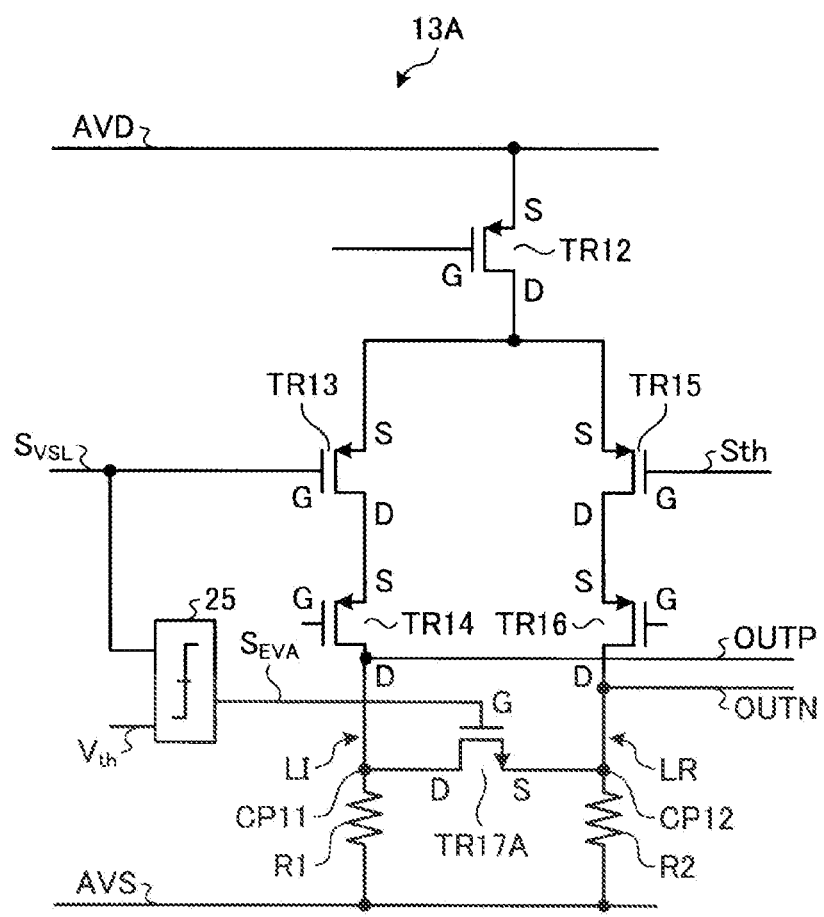
FIG. 7 is a diagram illustrating a detailed configuration of a preamplifier section according to a second modification of the first embodiment.

FIG. 7 is a diagram illustrating a detailed configuration of a preamplifier section according to a second modification of the first embodiment.

In FIG. 7, elements similar to those depicted in FIG. 4 are designated by the same reference signs as the corresponding elements.

A preamplifier section 13A according to the second modification of the first embodiment differs from the preamplifier section 13 according to the first embodiment in that the former includes a comparison determination circuit 25 and an N-channel MOS transistor TR17A. The comparison determination circuit 25 compares the voltage of the pixel signal $S_{VSL}$ with a standard comparison voltage $V_{th}$ corresponding to a predetermined excessive input state, and outputs a determination result signal $S_{EVA}$. The N-channel MOS transistor TR17A is configured such that a drain terminal D is connected to a connection point CP11 between the drain terminal D of the P-channel MOS transistor TR14 and the resistance R1, and a source terminal S is connected to a connection point CP12 between the drain terminal D of the P-channel MOS transistor TR16 and the resistance R2. When the determination result signal $S_{EVA}$ outputted from the comparison determination circuit 25 is inputted to the gate terminal G of the N-channel MOS transistor TR17A, the N-channel MOS transistor TR17A functions as a switch for forming a short circuit between the connection points CP11 and CP12.

The second modification of the first embodiment is also configured to turn on (close) the N-channel MOS transistor TR17A in a case where the voltage of the pixel signal $S_{VSL}$ is lower than the standard comparison voltage $V_{th}$ corresponding to the predetermined excessive input state. Therefore, a short circuit is formed between the connection points CP11 and CP12, so that the voltages of the preamplifier outputs OUTP and OUTN are substantially equal to each other. This makes it possible to reduce the difference of the voltages inputted to the comparator section 14.

Third Modification of First Embodiment

Figure 8:
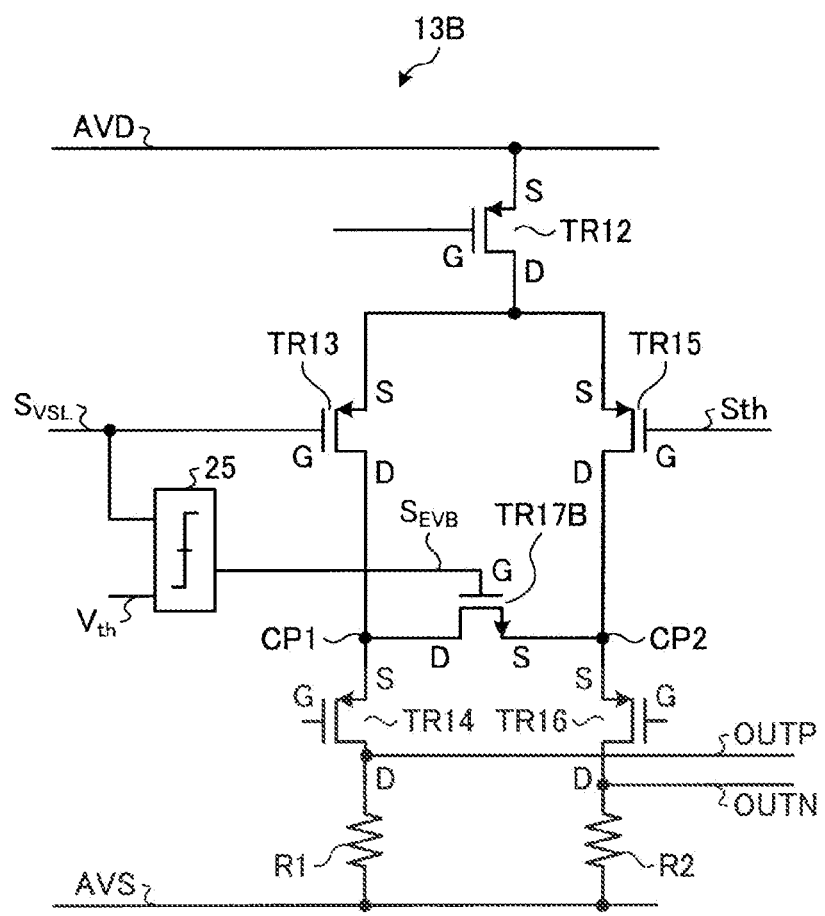
FIG. 8 is a diagram illustrating a detailed configuration of a preamplifier section according to a third modification of the first embodiment.

FIG. 8 is a diagram illustrating a detailed configuration of a preamplifier section according to a third modification of the first embodiment.

In FIG. 8, elements similar to those depicted in FIG. 4 are designated by the same reference signs as the corresponding elements.

A preamplifier section 13B according to the third modification of the first embodiment differs from the preamplifier section 13 according to the first embodiment in that the former includes a comparison determination circuit 25 for comparing the voltage of the pixel signal $S_{VSL}$ with a standard comparison voltage $V_{th}$ corresponding to a predetermined excessive input state and outputting a determination result signal $S_{EVB}$, and that the result of determination by the comparison determination circuit 25 is inputted to a gate terminal G of an N-channel MOS transistor TR17B.

The third modification of the first embodiment is also configured to turn on (close) the N-channel MOS transistor TR17B in a case where the voltage of the pixel signal $S_{VSL}$ is lower than the standard comparison voltage $V_{th}$ corresponding to the predetermined excessive input state. Therefore, the voltages of the preamplifier outputs OUTP and OUTN are substantially equal to each other. This makes it possible to reduce the difference of the voltages inputted to the comparator section 14.

Fourth Modification of First Embodiment

The foregoing description assumes that the MOS transistor at an input stage of the preamplifier section 13B is configured as a P-channel MOS transistor. However, the MOS transistor at the input stage of the preamplifier section 13B may alternatively be configured as an N-channel MOS transistor.

(2) Second Embodiment

[Detailed Configuration of Comparator Section According to Second Embodiment]

Figure 9:
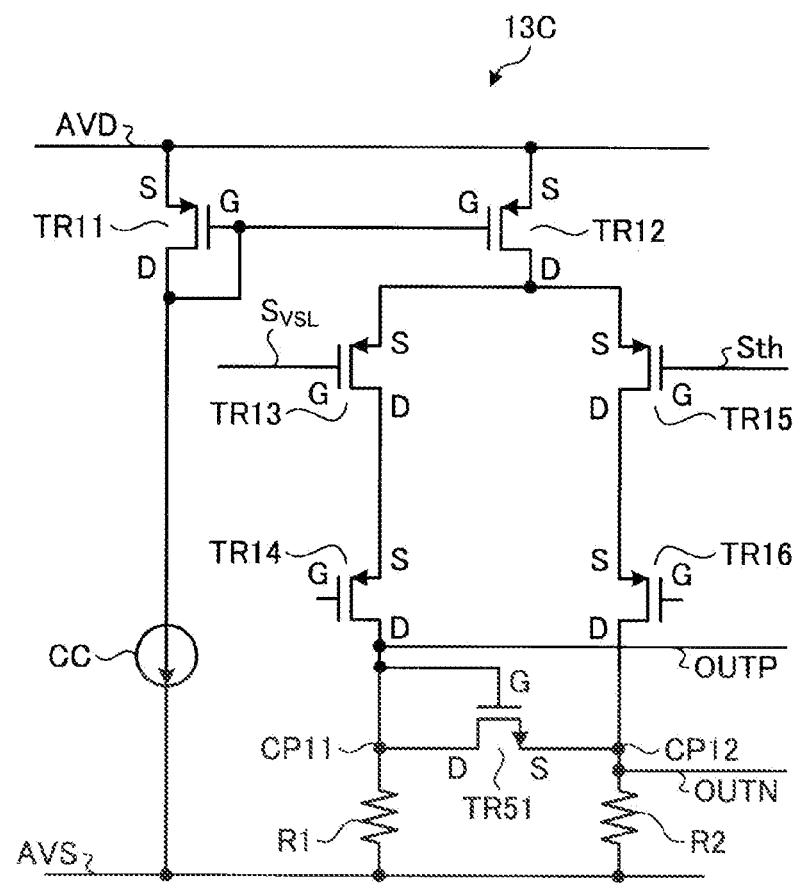
FIG. 9 is a diagram illustrating a detailed configuration of a preamplifier section according to a second embodiment.

FIG. 9 is a diagram illustrating a detailed configuration of a preamplifier section according to a second embodiment.

In FIG. 9, elements similar to those of the first embodiment depicted in FIG. 4 are designated by the same reference signs as the corresponding elements.

A preamplifier section 13C according to the second embodiment differs from the preamplifier section 13 according to the first embodiment in that the former includes an N-channel MOS transistor TR51. The N-channel MOS transistor TR51 functions as a diode in place of the N-channel MOS transistor TR17 and the threshold value determination circuit 21.

In the above configuration, the N-channel MOS transistor TR51 is configured such that a drain terminal D is connected to a connection point CP11 between the drain terminal D of the P-channel MOS transistor TR14 and the resistance R1, a source terminal S is connected to a connection point CP12 between the drain terminal D of the P-channel MOS transistor TR16 and the resistance R2, and a gate terminal G is connected to the connection point CP11.

In a case where the difference between the voltage of the pixel signal $S_{VSL}$ and the voltage of the threshold voltage signal $S_{th}$ is great and the difference between the first output signal OUTP and the second output signal OUTN is great, the N-channel MOS transistor TR51 is turned on (placed into a conductive state). Therefore, the differential voltage between the first output signal OUTP and the second output signal OUTN can be reduced to the threshold voltage of the N-channel MOS transistor TR51 acting as a diode. As compared with the first embodiment, the above-described method eliminates necessity for the comparison time in the excessive input determination and a feedback signal supplied from the sequential conversion logic section 15.

Further, since an excessive input is applied only from the pixel signal $S_{VSL}$ side, another one of features of the second embodiment is that the gate terminal G of the N-channel MOS transistor TR51 functioning as a diode is connected to the pixel signal $S_{VSL}$ side.

However, in order to match load capacities, it is also possible to configure an N-channel MOS transistor similar to the TR51 such that a gate and a drain are connected to the CP12 side and a source is connected to the CP11 side.

[Detailed Configuration of Comparator Section According to First Modification of Second Embodiment]

Figure 10:
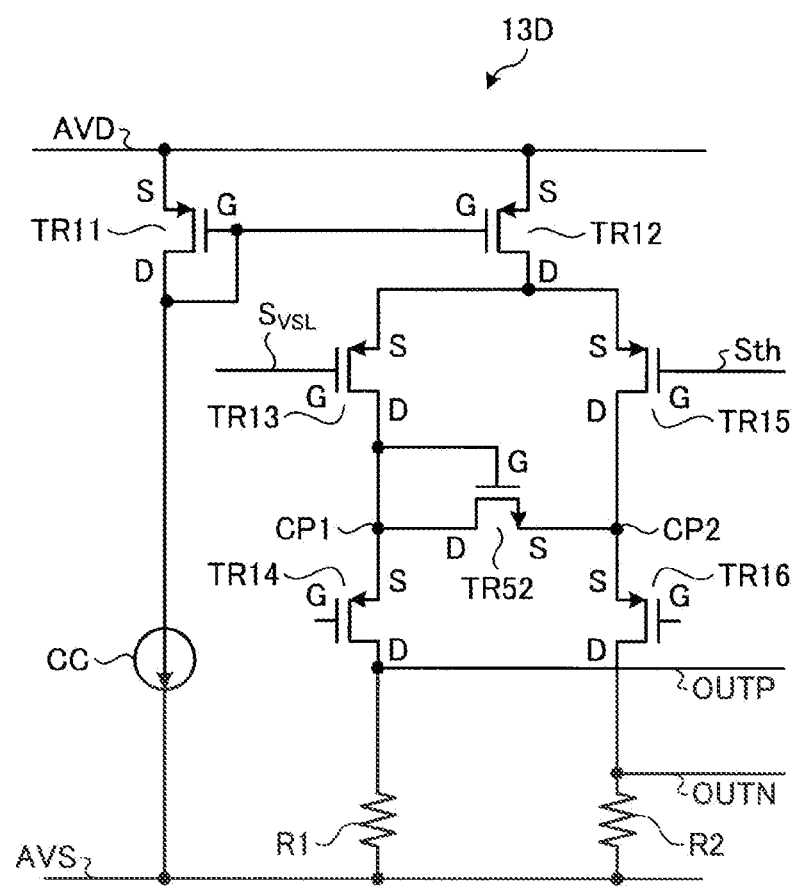
FIG. 10 is a diagram illustrating a detailed configuration of a preamplifier section according to a first modification of the second embodiment.

FIG. 10 is a diagram illustrating a detailed configuration of a preamplifier section according to a first modification of the second embodiment.

In FIG. 10, elements similar to those of the first embodiment depicted in FIG. 4 are designated by the same reference signs as the corresponding elements.

A preamplifier section 13D according to the second embodiment differs from the preamplifier section 13 according to the first embodiment in that the former includes an N-channel MOS transistor TR52 functioning as a diode in place of the N-channel MOS transistor TR17 and the threshold value determination circuit 14.

In the above configuration, the N-channel MOS transistor TR52 is configured such that a drain terminal D is connected to the connection point CP1 between the drain terminal D of the P-channel MOS transistor TR13 and the source terminal S of the P-channel MOS transistor TR14, a source terminal S is connected to the connection point CP2 between the drain terminal D of the P-channel MOS transistor TR15 and the source terminal S of the P-channel MOS transistor TR16, and a gate terminal G is connected to the connection point CP1.

According to the above configuration, the N-channel MOS transistor TR52 is turned on (placed into a conductive state) in a case where the difference between the voltage of the pixel signal $S_{VSL}$ and the voltage of the threshold voltage signal $S_{th}$ is great and the difference between the first output signal OUTP and the second output signal OUTN is great. This makes it possible to reduce the differential voltage between the first output signal OUTP and the second output signal OUTN. As compared with the first embodiment, the above-described method eliminates the necessity for the comparison time in the threshold value determination and the feedback signal supplied from the sequential conversion logic section 15.

In the above case, too, an excessive input is applied only from the pixel signal $S_{VSL}$ side similarly to the second embodiment. Therefore, another one of features of the first modification of the second embodiment is that the gate terminal G of the N-channel MOS transistor TR52 functioning as a diode is connected to the pixel signal $S_{VSL}$ side.

However, in order to match load capacities, it is also possible to configure an N-channel MOS transistor similar to the TR52 such that a gate and a drain are connected to the CP2 side and a source is connected to the CP1 side.

Second Modification of Second Embodiment

The foregoing description assumes that the MOS transistor at an input stage of the preamplifier section 13C is configured as a P-channel MOS transistor. However, the MOS transistor at the input stage of the preamplifier section 13C may alternatively be configured as an N-channel MOS transistor.

(3) Third Embodiment

[Detailed Configuration of Comparator Section According to Third Embodiment]

Figure 11:
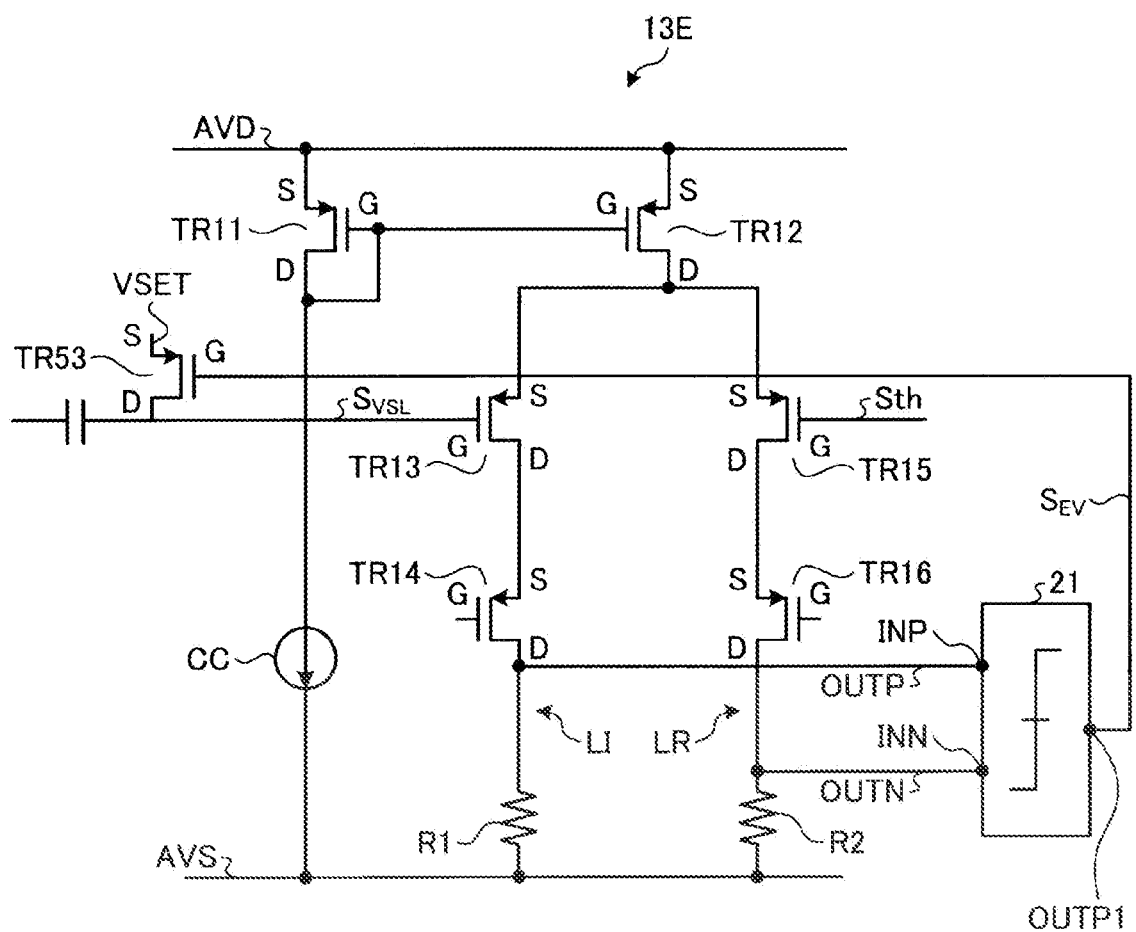
FIG. 11 is a diagram illustrating a detailed configuration of a preamplifier section according to a third embodiment.

FIG. 11 is a diagram illustrating a detailed configuration of a preamplifier section according to a third embodiment.

In FIG. 11, elements similar to those of the first embodiment depicted in FIG. 4 are designated by the same reference signs as the corresponding elements.

A preamplifier section 13E according to the third embodiment differs from the preamplifier section 13 according to the first embodiment in that the former includes, in place of the N-channel MOS transistor TR17, a P-channel MOS transistor TR53 that applies an initial voltage VSET corresponding to the case of standard pixel signal conversion to the gate terminal G of the P-channel MOS transistor TR13 on the basis of the determination result signal $S_{EV}$ outputted from the threshold value determination circuit 21.

In the above configuration, the P-channel MOS transistor TR53 is configured such that a drain terminal D is connected to the gate terminal G of the P-channel MOS transistor TR13 and a gate terminal G is connected to an output terminal OUTP1 of the threshold value determination circuit 21.

In a case where the threshold value determination circuit 21 detects that the voltage of the pixel signal $S_{VSL}$ is lower than the standard comparison voltage $V_{th}$ corresponding to a predetermined excessive input state, the present third embodiment turns on (closes) the P-channel MOS transistor TR53. Therefore, the initial voltage VSET is applied to the gate terminal G of the P-channel MOS transistor TR13 in the preamplifier section 13E so as to perform conversion similar to the standard pixel signal conversion. Consequently, an influence exerted on other columns is the same as at the time of the standard pixel signal conversion. This reduces an influence exerted after CDS (Correlated Double Sampling). This makes it possible to reduce deterioration of an amount of streaking.

[Detailed Configuration of Preamplifier Section According to First Modification of Third Embodiment]

Figure 12:
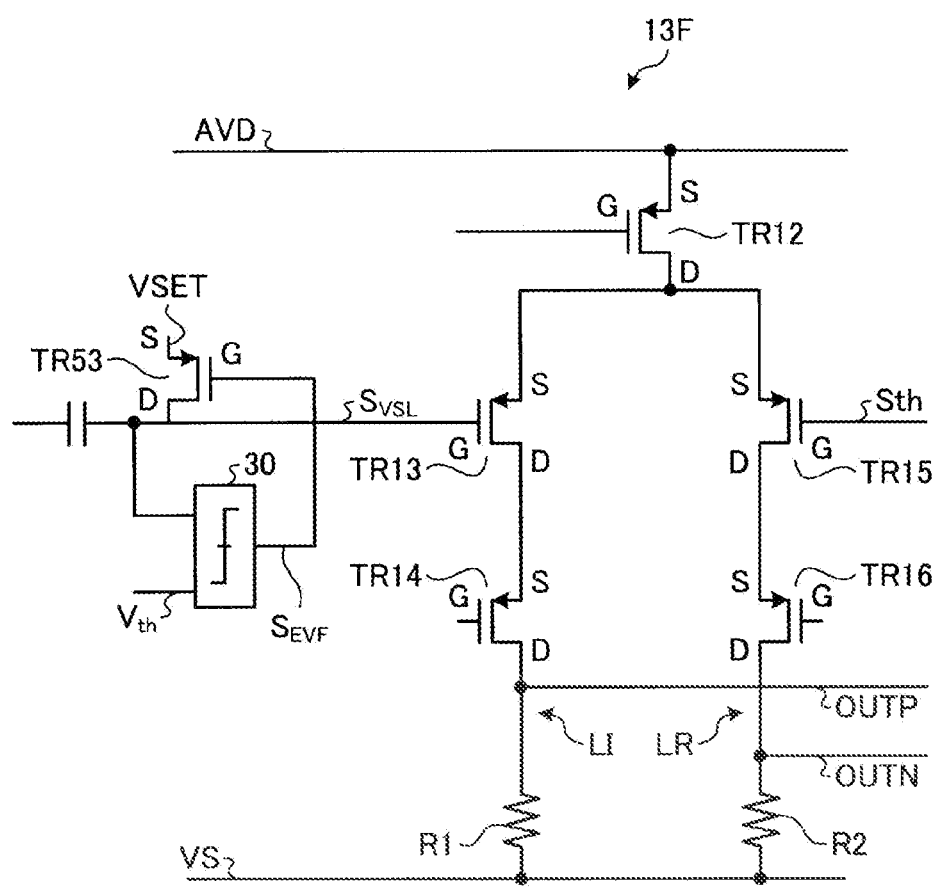
FIG. 12 is a diagram illustrating a detailed configuration of a preamplifier section according to a first modification of the third embodiment.

FIG. 12 is a diagram illustrating a detailed configuration of a preamplifier section according to a first modification of the third embodiment.

In FIG. 12, elements similar to those of the third embodiment depicted in FIG. 11 are designated by the same reference signs as the corresponding elements.

A preamplifier section 13F according to the first modification of the third embodiment differs from the preamplifier section 13E according to the third embodiment in that the former includes a threshold value determination circuit 30. The threshold value determination circuit 30 compares the voltage of the pixel signal $S_{VSL}$ with the standard comparison voltage $V_{th}$ corresponding to the predetermined excessive input state, and outputs a determination result signal $S_{EVF}$ to the gate terminal G of the P-channel MOS transistor TR53.

Also in a case where the voltage of the pixel signal $S_{VSL}$ is lower than the standard comparison voltage $V_{th}$ corresponding to the predetermined excessive input state, the first modification of the third embodiment also turns on (closes) the P-channel MOS transistor TR53. Therefore, the initial voltage VSET is applied to the gate terminal G of the P-channel MOS transistor TR13 in the preamplifier section 13F so as to perform conversion similar to the standard pixel signal conversion. Consequently, the influence exerted on the other columns is the same as at the time of the standard pixel signal conversion. This reduces the influence exerted after CDS (Correlated Double Sampling). This makes it possible to reduce the deterioration of the amount of streaking.

A configuration of an initial voltage setting circuit used in the above embodiment will now be briefly described.

Figure 13:
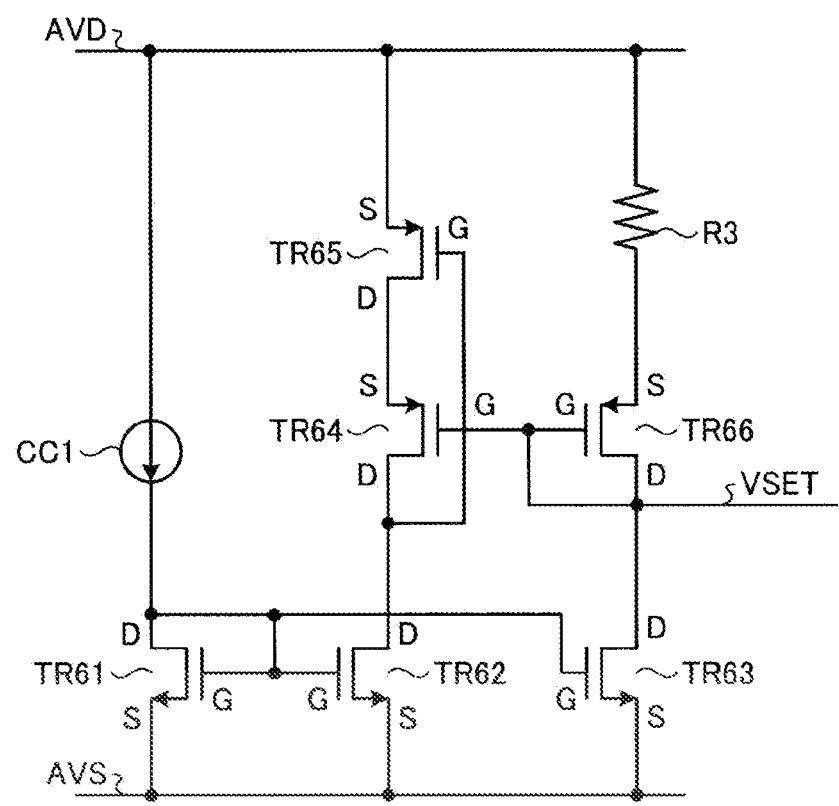
FIG. 13 is a diagram illustrating an example of an initial voltage setting circuit.

FIG. 13 is a diagram illustrating an example of the initial voltage setting circuit.

The initial voltage setting circuit ensures a drain terminal-to-source terminal voltage Vds of the P-channel MOS transistor TR12, which functions as a current source when the voltage of a resistance R3 drops, and also defines and sets an initial value voltage $V_{SET}$ to be applied to the gate terminal G of the P-channel MOS transistor TR13 in the preamplifier section 13.

(4) Fourth Embodiment

The foregoing embodiments have been described in relation to an A/D converter that processes one pixel. However, a fourth embodiment described below is an embodiment of a signal processing section that includes a plurality of A/D converters configured to sequentially perform A/D conversion processing on a plurality of pixels.

[Schematic Configuration of Signal Processing Section According to Fourth Embodiment]

Figure 14:
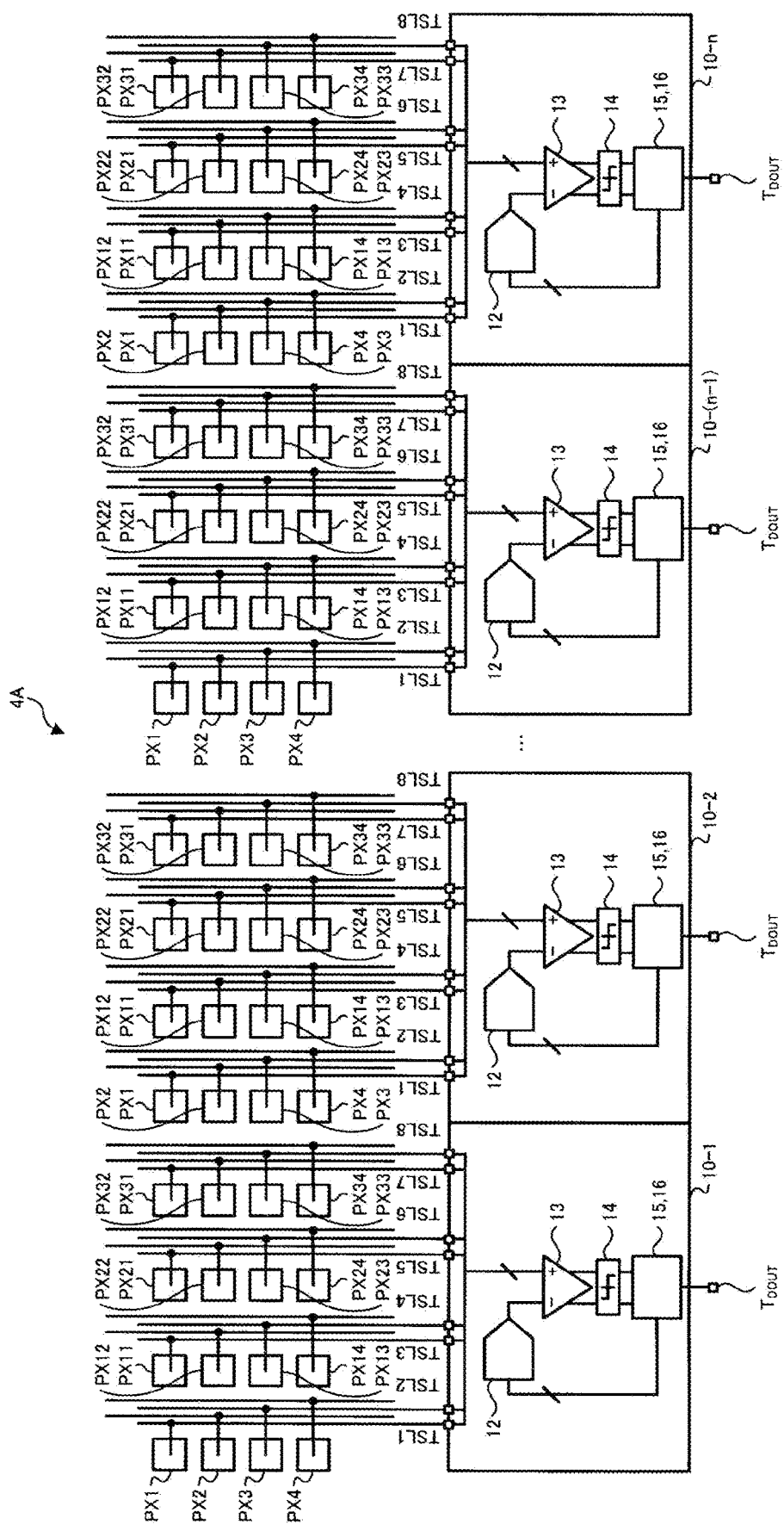
FIG. 14 is a block diagram illustrating a schematic configuration of a signal processing section according to a fourth embodiment.

FIG. 14 is a block diagram illustrating a schematic configuration of a signal processing section according to the fourth embodiment.

A signal processing section 4A depicted in FIG. 14 is an example illustrating a case where each A/D converter performs time-sharing processing on eight pixels. For simplified illustration, FIG. 14 depicts n A/D converters 10-1 to 10-n (n is a natural number) although 2n A/D converters are included in the signal processing section 4A. In reality, the remaining n A/D converters are disposed on an upper side of upward-extending output signal lines from the pixels in the figure.

In the above case, configurations of the A/D converters 10-1 to 10-n are similar to that of the A/D converter 10 illustrated in FIG. 2. Depicted in FIG. 14 are the D/A conversion section 12, the preamplifier section 13, the comparator section 14, the sequential conversion logic section 15, and the rotation logic section 16.

In the case depicted in FIG. 14, eight pixels, that is, half a total of 16 pixels including pixels PX1 to PX4, pixels PX11 to PX14, pixels PX21 to PX24, and pixels PX31 to PX34, are assigned to each of the A/D converters 10-1.

More specifically, a total of eight pixels, namely, the pixels PX1, PX3, PX11, PX13, PX21, PX23, PX31, and PX33, are assigned to the A/D converter 10-1 depicted in the figure.

Similarly, a total of eight pixels, namely, the pixels PX2, PX4, PX12, PX14, PX22, PX24, PX32, and PX3, are assigned to each of non-depicted A/D converters.

(Basic Operations of Signal Processing Section According to Fourth Embodiment)

Basic operations of the signal processing section 4A according to the fourth embodiment will now be described.

The A/D converters 10-1 to 10-$n$ and non-depicted n A/D converters included in the signal processing section 4A perform independent processing in synchronism with each other. Therefore, the basic operations, for example, of the A/D converter 10-1 are described below.

When, for example, performing a single data read operation, the A/D converter 10-1 sequentially performs processing on the pixel PX1, the pixel PX3, the pixel PX11, the pixel PX13, the pixel PX21, the pixel PX23, the pixel PX31, and the pixel PX33 in the order named.

More specifically, at a first processing timing for a single data read operation, the D/A conversion section 12 of the A/D converter 10-1 uses the plurality of types of local standard reference signals Sref generated by the local reference voltage generation sections 11 to perform digital/analog (D/A) conversion on the control data $D_{CNT}$ under the control of the later-described sequential conversion logic section and rotation logic section, and outputs the threshold voltage signal $S_L$, to the preamplifier 13.

Consequently, the preamplifier section 13 amplifies the pixel signal $S_{VSL}$ corresponding to the pixel PX1 inputted from a pixel signal input terminal TSL1 and the threshold voltage signal $S_{th}$ inputted from the D/A converter 12, and outputs the amplified signals to the comparator section 14.

The comparator section 14 compares the above preamplifier outputs, and outputs the comparison result data $D_{CMP}$ to the sequential conversion logic section 15.

The sequential conversion logic section 15 not only outputs sequential conversion control data $D_{SAR}$ for exercising sequential conversion control over analog/digital conversion of the comparison result data $D_{CMP}$, but also stores the inputted comparison result data $D_{CMP}$, and then, based on the stored comparison result data $D_{CMP}$, outputs the pixel data $D_{VSL}$ representing the result of analog/digital (A/D) conversion of the pixel signal $S_{VSL}$, from the output terminal $TD_{OUT}$.

Subsequently, at timings from a second processing timing to an eighth processing timing, the A/D converter 10-1 similarly executes a process of performing analog/digital (A/D) conversion on the pixel signals $S_{VSL}$ corresponding to the respective pixels, that is, the pixel PX3 inputted from a pixel signal input terminal TSL2, the pixel PX11 inputted from a pixel signal input terminal TSL3, the pixel PX13 inputted from a pixel signal input terminal TSL4, the pixel PX21 inputted from a pixel signal input terminal TSL5, the pixel PX23 inputted from a pixel signal input terminal TSL6, the pixel PX31 inputted from a pixel signal input terminal TSL7, and the pixel PX33 inputted from a pixel signal input terminal TSL8, and outputting the result of conversion from the output terminal $TD_{OUT}$.

In the above instance, the A/D converters 10-2 to 10-$n$ and the non-depicted n A/D converters also perform a process similar to the above in a parallel manner.

As described above, the fourth embodiment provides an additional advantageous effect in addition to that of the first embodiment. More specifically, as compared with a case where the number of included A/D converters is the same as the number of pixels, the fourth embodiment is able to decrease the number of included A/D converters to approximately ⅛, and thus reduce a circuit area of the signal processing section 4A. This makes it possible to reduce a footprint of the solid-state imaging device and downsize an apparatus incorporating the solid-state imaging device.

(5) Fifth Embodiment

Figure 15:
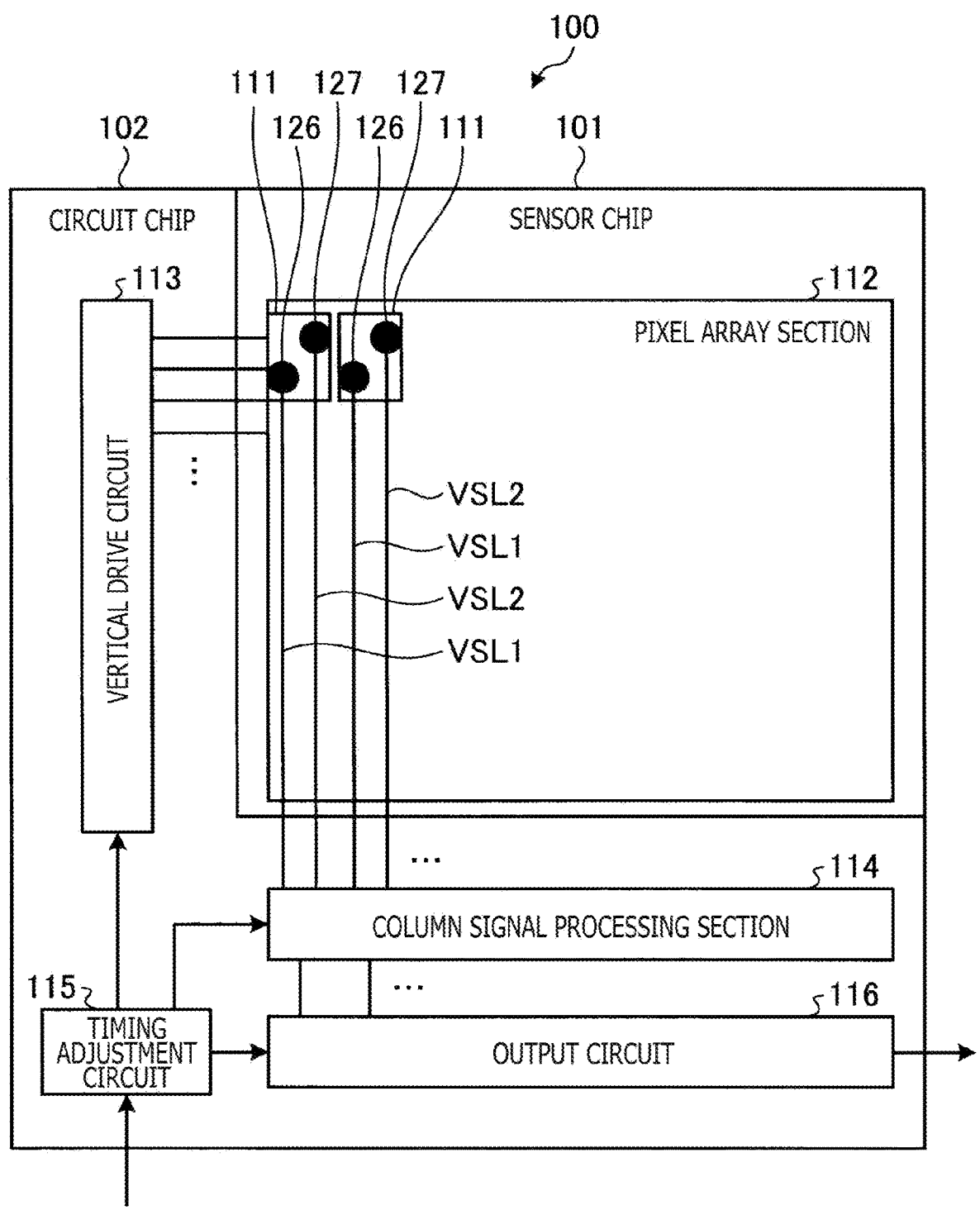
FIG. 15 is a block diagram illustrating an example of an indirect time-of-flight distance sensor to which the present technology is applied.

FIG. 15 is a block diagram illustrating an example of an indirect time-of-flight distance sensor to which the present technology is applied.

The indirect time-of-flight (Indirect-Time of Flight) distance sensor 100 includes a sensor chip 101 and a circuit chip 102. The circuit chip 102 is stacked on the sensor chip 101.

A pixel array section 112 includes a plurality of pixels 111 that is arrayed in a two-dimensional grid pattern on the sensor chip 101. Here, the pixel array section 112 may be disposed in a matrix and may include a plurality of column signal lines. The column signal lines are connected to the respective pixels.

Disposed on the circuit chip 102 are a vertical drive circuit 113, a column signal processing section 114, a timing adjustment circuit 115, and an output circuit 116.

The vertical drive circuit 113 is configured to drive the pixels and output pixel signals to the column signal processing section 114.

The column signal processing section 114 performs A/D conversion processing on inputted pixel signals, and outputs A/D converted pixel data to the output circuit 116.

The output circuit 116 performs, for example, CDS (Correlated Double Sampling) processing on the pixel data from the column signal processing section 114, and outputs the processed pixel data to a signal processing circuit at a subsequent stage.

The timing control circuit 115 is configured to control respective drive timings of the vertical drive circuit 113. The column signal processing section 114 and the output circuit 116 operate in synchronism with vertical synchronization signals outputted from the timing control circuit 115.

The pixels 111 included in the pixel array section 112 will now be described in detail.

Figure 16:
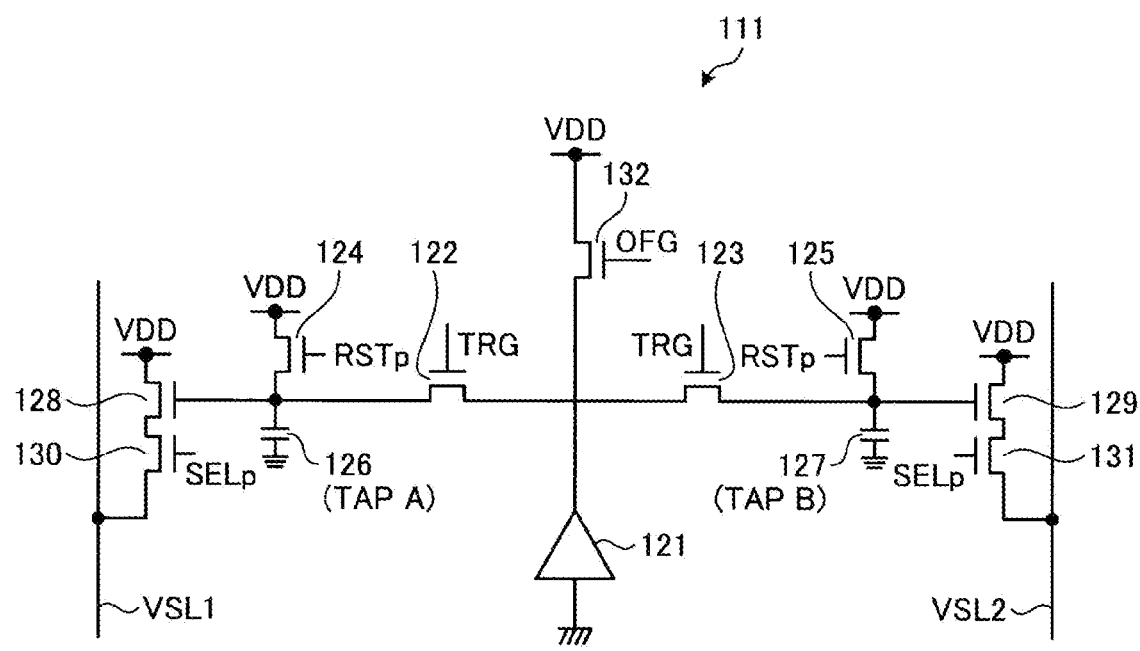
FIG. 16 is a circuit diagram illustrating a configuration example of a pixel according to an embodiment of the present technology.

FIG. 16 is a circuit diagram illustrating a configuration example of a pixel according to an embodiment of the present technology.

The pixel array section 112 includes the plurality of pixels 111 arrayed in a two-dimensional grid pattern. Each of the pixels 111 is configured to be able to receive infrared light and photoelectrically convert the received infrared light to a pixel signal.

Further, vertical signal lines VSL1 and VSL2 are vertically wired to each column of the pixels 111. When the total number of columns in the pixel array section 112 is M (M is an integer), a total of 2×M vertical signal lines are wired. Each pixel has two taps. The vertical signal line VSL1 is connected to a tap A of each pixel 111 while the vertical signal line VSL2 is connected to a tap B of each pixel 111. Furthermore, the vertical signal line VSL1 transmits a pixel signal AINP1 while the vertical signal line VSL2 transmits a pixel signal AINP2.

The vertical drive circuit 113 sequentially selects and drives the rows of the pixel area 112 so as to cause each row to simultaneously output the pixel signals AINP1 and AINP2 for each pixel block 221. That is, the vertical drive circuit 113 simultaneously drives the 2k-th and (2k+1)-th rows of the pixels 111.

The pixels 111 each include a photodiode 121, two transfer transistors 122 and 123, two reset transistors 124 and 125, two taps (floating diffusion layers 126 and 127), two amplifying transistors 128 and 129, and two select transistors 130 and 131.

The photodiode 121 photoelectrically converts received light to generate electric charge. The photodiode 121 is disposed on a back surface of a semiconductor substrate while circuits are disposed on a front surface of the semiconductor substrate. This type of solid-state imaging device is called a back-illuminated solid-state imaging device. Alternatively, in place of the back-illuminated configuration, a front-illuminated configuration may be adopted in which the photodiode 121 is disposed on the front surface the semiconductor substrate.

The transfer transistor 122 and the transfer transistor 123 sequentially transfer electric charge from the photodiode 121 to the TAP A 126 and the TAP B 127, respectively, according to a transfer signal TRG from the vertical drive circuit 113.

The TAP A 126 and the TAP B 127 accumulate the transferred electric charge, and generate a voltage according to an amount of the accumulated electric charge.

An overflow transistor 132 is a transistor that sequentially discharges the electric charge of the photodiode 121 to a high-potential power supply VDD and functions to reset the photodiode 121.

The reset transistors 124 and 125 draw the electric charge from the TAP A 126 and the TAP B 127, respectively, according to a reset signal RSTp from the vertical drive circuit 113, for the purpose of initializing the amount of electric charge.

The amplifying transistors 128 and 129 amplify the respective voltages of the TAP A 126 and the TAP B 127. The select transistors 130 and 131 output signals of the amplified voltages as pixel signals to the column signal processing section 114 through two vertical signal lines (e.g., VSL1 and VSL2) according to a selection signal SELp from the vertical drive circuit 113. The vertical signal line and the vertical signal line VSL2 are connected to an input of one A/D converter 10 in the column signal processing section 114.

It should be noted that the circuit configuration of the pixels 111 is not limited to the one illustrated in FIG. 15 as long as pixel signals can be generated by photoelectric conversion.

As is the case with the fourth embodiment, the fifth embodiment is able to reduce the footprint of the solid-state imaging device and downsize the indirect time-of-flight distance sensor.

It should be noted that the advantageous effects described in this document are merely illustrative and not restrictive. The present technology may provide advantageous effects other than those described in this document.

It should be noted that the present technology can also adopt the following configurations.

(1)
An A/D converter including:
a comparator circuit that performs comparison with a threshold voltage to determine whether or not an excessive input of a pixel signal has been made; and
a first transistor that has a control terminal and forms a clamp circuit, the control terminal being configured to receive an input of a result of the comparison.

(2)
The A/D converter as described in (1), in which currents flowing to a first predetermined position and a second predetermined position are equalized or voltages at the first predetermined position and the second predetermined position are equalized, the first predetermined position and the second predetermined position being connected to each other at the time of clamping.

(3)
The A/D converter as described in (1) or (2), further including:
a pair of differential pair transistors that form an input current line and a reference current line; and
a pair of bias transistors that control a bias current flowing to the differential pair transistors,
in which the first transistor is disposed either upstream or downstream of the pair of bias transistors.

(4)
The A/D converter as described in any one of (1) to (3),
in which the clamp circuit includes a threshold value determination circuit that determines whether or not a signal having a value equal to or greater than a predetermined excessive input threshold value has been inputted as the pixel signal, and
based on an output from the threshold value determination circuit, the first transistor forms a short circuit between the first predetermined position and the second predetermined position connected at the time of clamping.

(5)
An A/D converter including:
a pair of differential pair transistors that form an input current line and a reference current line;
a pair of bias transistors that control a bias current flowing to the differential pair transistors; and
a diode that includes an anode and a cathode, the anode being connected to a first predetermined position, the cathode being connected to a second predetermined position, the first predetermined position and the second predetermined position being to be connected at the time of clamping.

(6)
Electronic equipment including:
a pixel array section including a plurality of pixels that performs photoelectric conversion and disposed in an array form; and
a signal processing section that reads an analog pixel signal from the pixel array section and performs signal processing,
in which the signal processing section includes an A/D converter that performs analog/digital conversion on the analog pixel signal, and
the A/D converter includes
a comparator circuit that performs comparison with a threshold voltage to determine whether or not a pixel signal and an excessive input have been inputted, and
a first transistor that has a control terminal and forms a clamp circuit, a result of the comparison being inputted as the control terminal.

(7)
Electronic equipment including:
a pixel array section including a plurality of pixels that performs photoelectric conversion and disposed in an array form; and
a signal processing section that reads an analog pixel signal from the pixel array section and performs signal processing, in which the signal processing section includes an A/D converter that performs analog/digital conversion on the analog pixel signal, and
the A/D converter includes
a pair of differential pair transistors that form an input current line and a reference current line,
a pair of bias transistors that control a bias current flowing to the differential pair transistors, and
a diode that includes an anode and a cathode, the anode being connected to a first predetermined position, the cathode being connected to a second predetermined position, the first predetermined position and the second predetermined position being to be connected at the time of clamping.

REFERENCE SIGNS LIST

2: Pixel array section
4: Signal processing section
10: A/D converter
11: Local reference voltage generation section
12: D/A conversion section
13, 13A to 13F: Preamplifier section
14: Comparator section
14A: Amplification section
14B: Latch section
15: Sequential conversion logic section
16: Rotation logic section
21: Threshold value determination circuit
CP1, CP11: Connection point (first predetermined position)
CP2, CP12: Connection point (second predetermined position)
TR17, TR17A, TR17B: N-channel MOS transistor (clamp circuit)
TR51, TR52: N-channel MOS transistor (clamp circuit)
TR53: P-channel MOS transistor (switching element)
DA: Differential amplifier
$S_{EV}$: Determination result signal

The invention claimed is:

1. An A/D converter comprising:
a comparator circuit that performs comparison with a threshold voltage to determine whether or not an excessive input of a pixel signal has been made; and
a first transistor that has a control terminal and forms a clamp circuit, the control terminal being configured to receive an input of a result of the comparison.

2. The A/D converter according to claim 1, wherein currents flowing to a first predetermined position and a second predetermined position are equalized or voltages at the first predetermined position and the second predetermined position are equalized, the first predetermined position and the second predetermined position being connected to each other at the time of clamping.

3. The A/D converter according to claim 2, further comprising:
a pair of differential pair transistors that form an input current line and a reference current line; and
a pair of bias transistors that control a bias current flowing to the differential pair transistors,
wherein the first transistor is disposed either upstream or downstream of the pair of bias transistors.

4. The A/D converter according to claim 1,
wherein the clamp circuit includes a threshold value determination circuit that determines whether or not a signal having a value equal to or greater than a predetermined excessive input threshold value has been inputted as the pixel signal, and
based on an output from the threshold value determination circuit, the first transistor forms a short circuit between the first predetermined position and the second predetermined position connected at the time of clamping.

5. An A/D converter comprising:
a pair of differential pair transistors that form an input current line and a reference current line;
a pair of bias transistors that control a bias current flowing to the differential pair transistors; and
a diode that includes an anode and a cathode, the anode being connected to a first predetermined position, the cathode being connected to a second predetermined position, the first predetermined position and the second predetermined position being to be connected at the time of clamping.

6. Electronic equipment comprising:
a pixel array section including a plurality of pixels that performs photoelectric conversion and disposed in an array form; and
a signal processing section that reads an analog pixel signal from the pixel array section and performs signal processing,
wherein the signal processing section includes an A/D converter that performs analog/digital conversion on the analog pixel signal, and
the A/D converter includes
a comparator circuit that performs comparison with a threshold voltage to determine whether or not a pixel signal and an excessive input have been inputted, and
a first transistor that has a control terminal and forms a clamp circuit, a result of the comparison being inputted as the control terminal.

* * * * *